United States Patent
Liao et al.

(10) Patent No.: US 11,050,132 B2
(45) Date of Patent: Jun. 29, 2021

(54) CHIP-TYPE ANTENNA IMPROVED STRUCTURE

(71) Applicant: Power Wave Electronic Co ., Ltd., Taipei (TW)

(72) Inventors: Wen-Jiao Liao, Taipei (TW); Yun-Chan Tsai, Taipei (TW); Shih-Hsun Hung, Taipei (TW); Shi-Hong Yang, Taipei (TW)

(73) Assignee: POWER WAVE ELECTRONIC CO., LTD., Taipei (TW)

( * ) Notice: Subject to any disclaimer, the term of this patent is extended or adjusted under 35 U.S.C. 154(b) by 105 days.

(21) Appl. No.: 16/690,775

(22) Filed: Nov. 21, 2019

(65) Prior Publication Data
US 2021/0159583 A1 May 27, 2021

(51) Int. Cl.
*H01Q 1/22* (2006.01)
*H01Q 1/48* (2006.01)
*H03H 7/01* (2006.01)
*H03H 7/38* (2006.01)
*H01Q 1/50* (2006.01)

(52) U.S. Cl.
CPC .............. *H01Q 1/22* (2013.01); *H01Q 1/48* (2013.01); *H01Q 1/50* (2013.01); *H03H 7/01* (2013.01); *H03H 7/38* (2013.01)

(58) Field of Classification Search
CPC ............ H01Q 1/22; H01Q 1/38; H01Q 1/243; H01Q 1/48–1/50; H03H 7/38
See application file for complete search history.

(56) References Cited

U.S. PATENT DOCUMENTS

| | | | |
|---|---|---|---|
| 10,090,593 B2* | 10/2018 | Chou | H01Q 1/38 |
| 10,916,852 B2* | 2/2021 | Chou | H01Q 9/42 |
| 2008/0079642 A1* | 4/2008 | Ishizuka | H01Q 1/243 |
| | | | 343/702 |

* cited by examiner

*Primary Examiner* — Hasan Islam
(74) *Attorney, Agent, or Firm* — Chun-Ming Shih; HDLS IPR Services

(57) ABSTRACT

A chip-type antenna structure includes a baseboard, a matching element, a radiation single body and a frequency-modulation element. The baseboard includes a first-ground surface, a first-clearance area and a signal-feed-in unit. A second-ground surface, a second-clearance area, a third-ground surface and a plurality of via holes through the baseboard and electrically connected to the first-ground surface and the second-ground surface are arranged on the other side of the baseboard. The matching element is electrically connected between the signal-feed-in unit and the first-ground surface. One side of the radiation single body is electrically connected to the signal-feed-in unit through the via holes. The other side of the radiation single body is electrically connected to the third-ground surface. The frequency-modulation element is electrically connected between the second-ground surface and the third-ground surface to adjust the frequency-modulation element to adjust a receiving-transmitting frequency of the chip-type antenna structure.

11 Claims, 5 Drawing Sheets

CHIP-TYPE ANTENNA IMPROVED STRUCTURE

BACKGROUND OF THE INVENTION

Field of the Invention

The present invention relates to an antenna structure, and especially relates to a chip-type antenna improved structure with a design that a metal plate is extended on a clearance area of the chip-type antenna improved structure.

Description of the Related Art

With the popularity of the Internet, people depend on the Internet increasingly, so that more and more mobile-Internet apparatuses are developed/provided, for examples, the desktop computer, the notebook computer, the tablet computer, the E-reader, the smart phone, and so on. When the mobile-Internet apparatuses are popular in the market, it is heard that besides the acquirement of the Internet information and the requirement of the convenience of the Internet interpersonal interaction, then people care the stability of the reception and the transmission of the communication systems.

The transmission or the reception of the information mainly depends on wireless local area network, Wi-Fi, 3G, global positioning system (GPS), radio frequency (RF) wireless module, RF SiP Module, RF system package component, RF SiP Component and so on, which are built in the mobile-Internet apparatuses. Correspondingly, the antennas used in these communication systems are chip-type antenna structures. The chip-type antenna structure comprises a radiation single body and a baseboard. The radiation single body is a base body made of a ceramic material or a fiberglass. Metal patterns which radiate signals are arranged on the base body. At least one ground surface, signal-feed-in lines and at least one clearance area are arranged on a surface of the baseboard. The radiation single body is arranged on the clearance area and is electrically connected to the signal-feed-in lines of the baseboard.

A little length of a micro strip line is added on the radiation single body or the baseboard of most of the chip-type antenna structures which are currently used. However, the micro strip line may have different lengths depending on different operating environments, so that the user is confused.

SUMMARY OF THE INVENTION

Therefore, the main object of the present invention is to solve the conventional deficiency. The present invention redesigns the chip-type antenna structure. A third-ground surface (namely, a metal plate) in an L-shaped is added on a clearance area of the chip-type antenna structure of the present invention. A frequency-modulation element is arranged at a terminal of the third-ground surface (namely, the metal plate), so that in any environments, a size of the third-ground surface (namely, the metal plate) does not need to be changed. Only the frequency-modulation element which is arranged at the terminal of the third-ground surface needs to be adjusted to adjust a frequency, so that the production process and the components are simplified, and the material prescription is highly replaceable.

In order to achieve the object mentioned above, the present invention provides a chip-type antenna improved structure. The chip-type antenna improved structure comprises a baseboard, at least one matching element, a radiation single body and a frequency-modulation element. A top of the baseboard comprises a first-ground surface, a first-clearance area and a signal-feed-in unit. The signal-feed-in unit is arranged on the first-clearance area and is extended between the first-ground surface. The signal-feed-in unit comprises a plurality of metal line segments (namely, the signal-feed-in unit is composed of a plurality of metal line segments). Moreover, a bottom of the baseboard comprises a second-ground surface corresponding to the first-ground surface, a second-clearance area corresponding to the first-clearance area, and a third-ground surface arranged on the second-clearance area. Moreover, the baseboard defines a plurality of via holes through the baseboard. The first-ground surface is electrically connected to the second-ground surface through the via holes. The at least one matching element is electrically connected between the metal line segments, and between the metal line segments and the first-ground surface. One side of the radiation single body is electrically connected to the signal-feed-in unit through one of the via holes. The other side of the radiation single body is electrically connected to the third-ground surface. The frequency-modulation element is electrically connected between the second-ground surface and the third-ground surface to adjust the frequency-modulation element to adjust a receiving-transmitting frequency of the chip-type antenna improved structure.

In an embodiment of the present invention, the first-ground surface is in a concave-shaped; the first-clearance area is in a convex-shaped.

In an embodiment of the present invention, the signal-feed-in unit is arranged on the first-clearance area and is extended to a concave-convex junction between the first-ground surface.

In an embodiment of the present invention, the third-ground surface is in an L-shaped.

In an embodiment of the present invention, a long gap and a short gap are defined between the third-ground surface and the second-ground surface.

In an embodiment of the present invention, the radiation single body comprises a base body and a metal layer which is arranged on a surface of the base body. Namely, the radiation single body is composed of a base body and a metal layer which is arranged on a surface of the base body.

In an embodiment of the present invention, the base body is made of a ceramic material or a fiberglass.

In an embodiment of the present invention, the metal layer comprises a plurality of blocks in different sizes or comprises a plurality of lines. Namely, the metal layer is composed of a plurality of blocks in different sizes or is composed of a plurality of lines.

In an embodiment of the present invention, the blocks are arranged on the surface of the base body directly.

In an embodiment of the present invention, the lines helically wind around and are arranged on the surface of the base body or inside the base body.

In an embodiment of the present invention, the at least one matching element and the frequency-modulation element are inductors or capacitors.

DETAILED DESCRIPTION OF THE INVENTION

Figure 1:
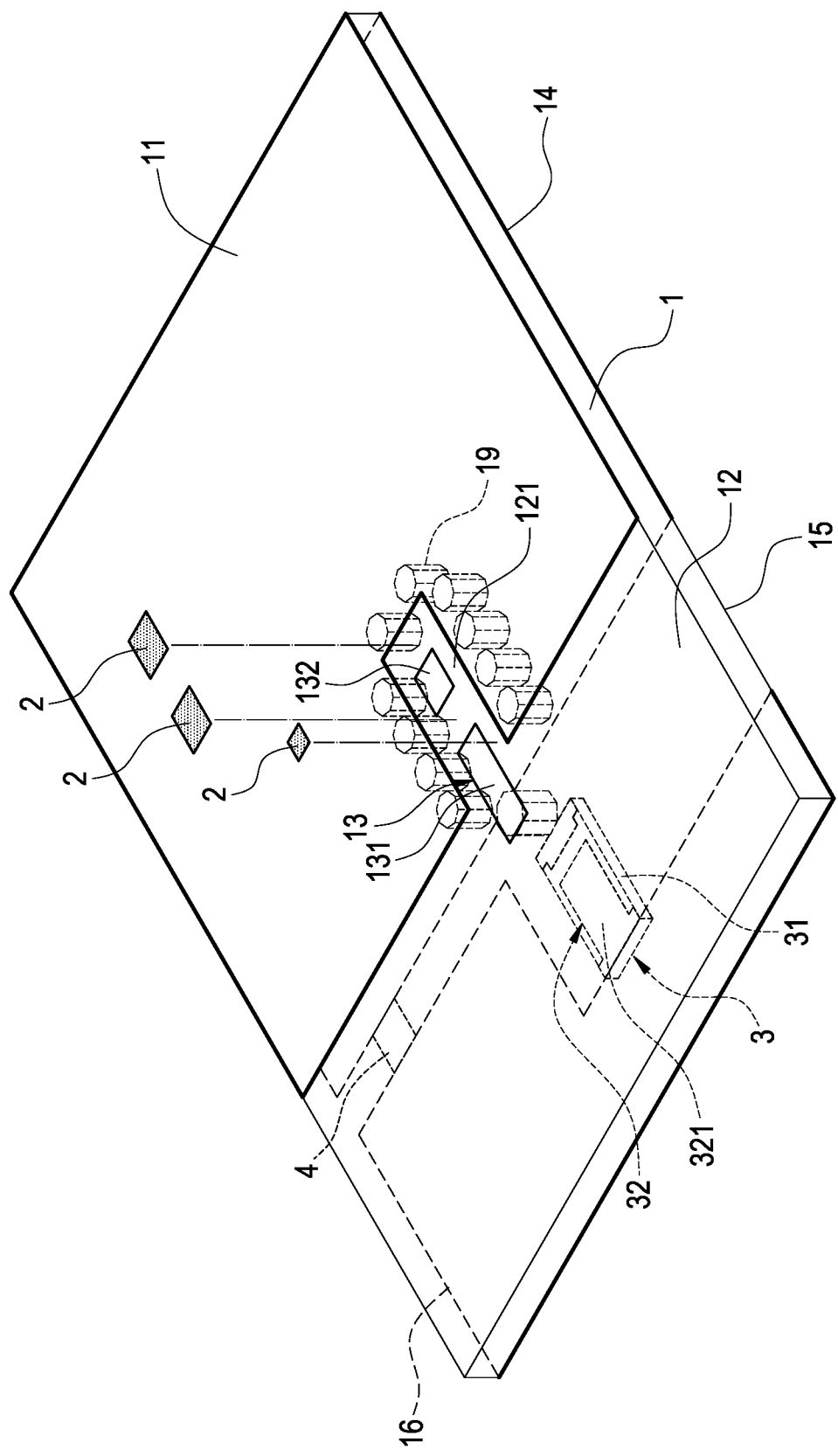
FIG. 1 shows an exploded view of the components on the top of the chip-type antenna improved structure of the present invention.
Figure 2:
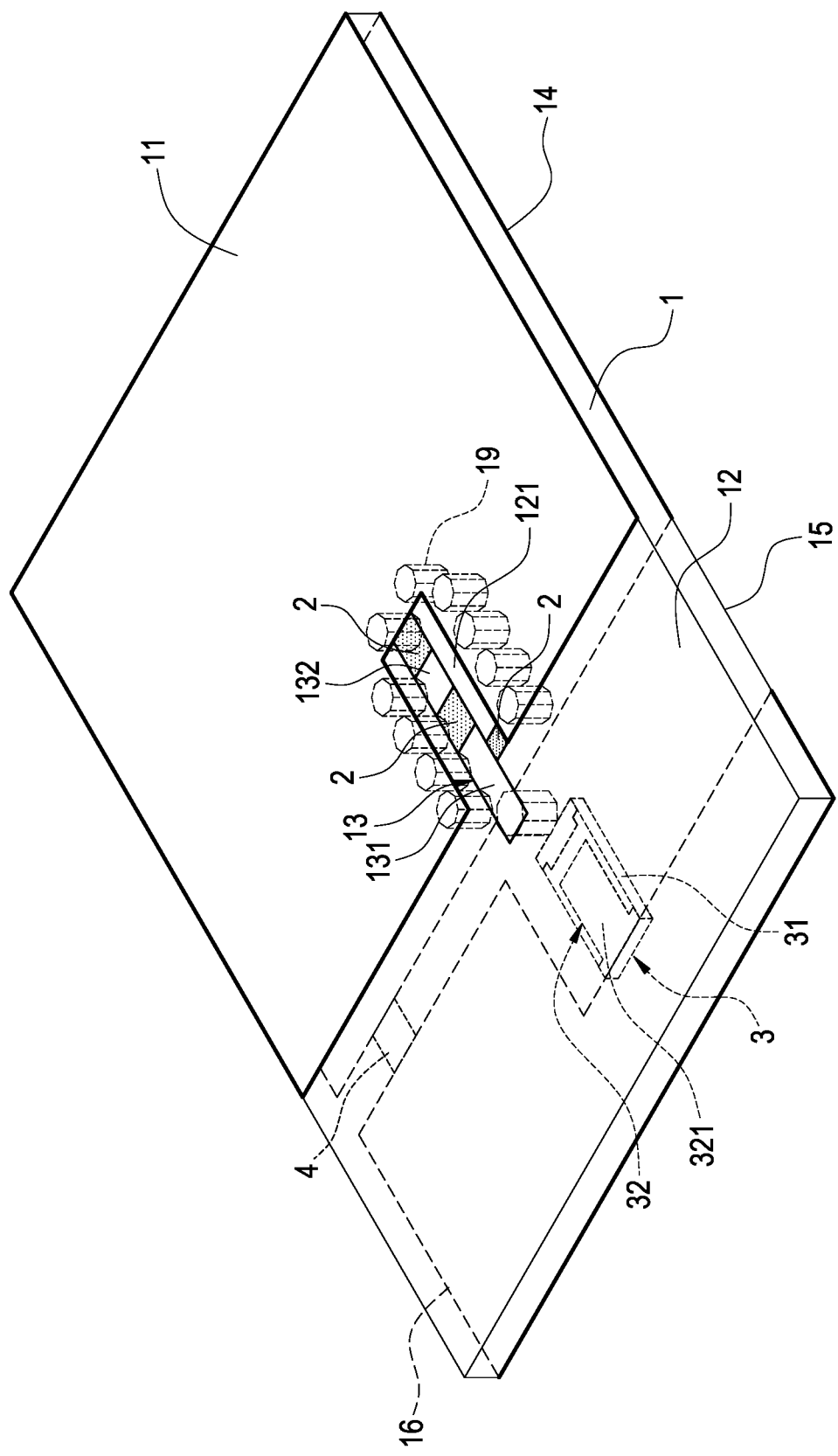
FIG. 2 shows an assembly drawing of the components on the top of the chip-type antenna improved structure of the present invention.

Now please refer to the figures for the explanation of the technical content and the detailed description of the present invention:

FIG. 1 shows an exploded view of the components on the top of the chip-type antenna improved structure of the present invention. FIG. 2 shows an assembly drawing of the components on the top of the chip-type antenna improved structure of the present invention. As shown in FIG. 1 and FIG. 2, a top of the chip-type antenna improved structure of the present invention comprises a baseboard 1 and at least one matching element 2.

A top of the baseboard 1 comprises a first-ground surface 11 in a concave-shaped, a first-clearance area 12 in a convex-shaped and a signal-feed-in unit 13. The signal-feed-in unit 13 is arranged on the first-clearance area 12 and is extended to a concave-convex junction 121 between the first-ground surface 11. The signal-feed-in unit 13 comprises a plurality of metal line segments 131, 132 (namely, the signal-feed-in unit 13 is composed of a plurality of metal line segments 131, 132).

The matching elements 2 are electrically connected between the metal line segments 131, 132 and the first-ground surface 11. The matching elements 2 can be used to adjust an impedance and a frequency of the chip-type antenna improved structure. In FIG. 1 and FIG. 2, the matching element 2 is an inductor or a capacitor, or an inductor and a capacitor.

Figure 3:
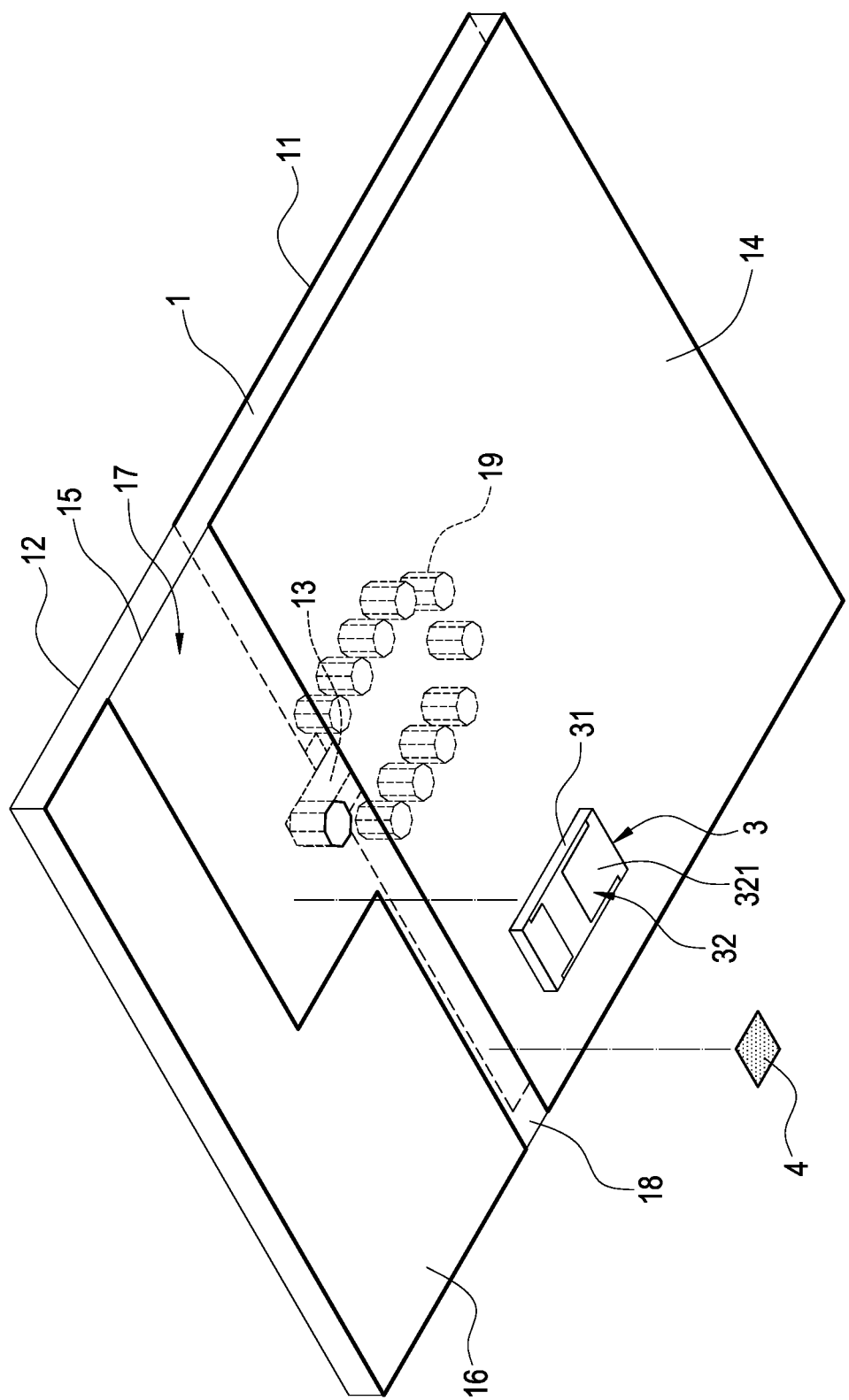
FIG. 3 shows an exploded view of the components on the bottom of the chip-type antenna improved structure of the present invention.
Figure 4:
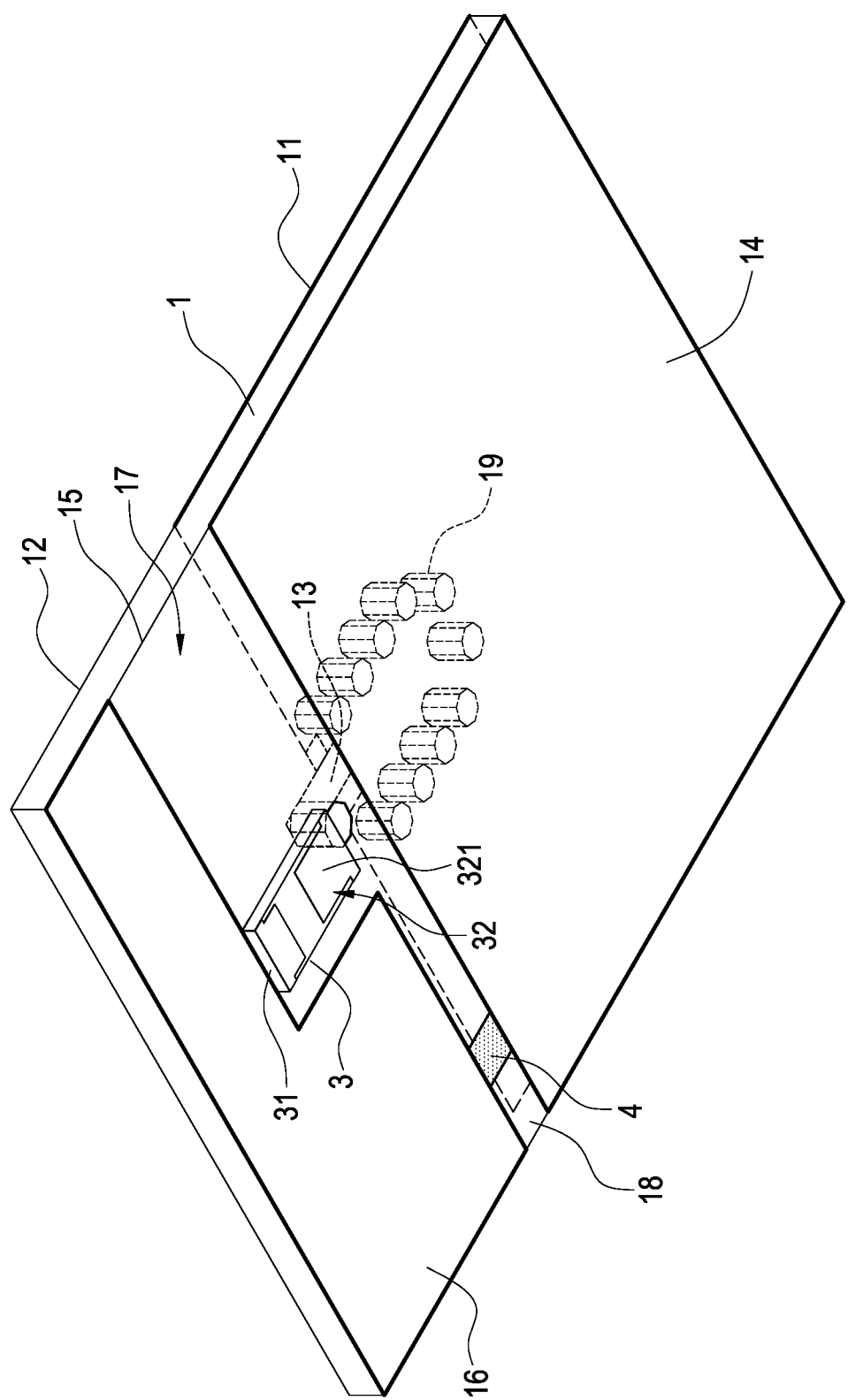
FIG. 4 shows an assembly drawing of the components on the bottom of the chip-type antenna improved structure of the present invention.

FIG. 3 shows an exploded view of the components on the bottom of the chip-type antenna improved structure of the present invention. FIG. 4 shows an assembly drawing of the components on the bottom of the chip-type antenna improved structure of the present invention. As shown in FIG. 3 and FIG. 4, a bottom of the chip-type antenna improved structure of the present invention comprises the baseboard 1 (shown in FIG. 1 and FIG. 2), a radiation single body 3 and a frequency-modulation element 4.

A bottom of the baseboard 1 comprises a second-ground surface 14 corresponding to the first-ground surface 11, a second-clearance area 15 corresponding to the first-clearance area 12, and a third-ground surface 16 (namely, a metal plate) in an L-shaped and arranged on the second-clearance area 15. A long gap 17 and a short gap 18 are defined between the second-ground surface 14 and the third-ground surface 16. Moreover, the baseboard 1 defines a plurality of via holes 19 through the baseboard 1. The first-ground surface 11 is electrically connected to the second-ground surface 14 through the via holes 19. One side of the radiation single body 3 is electrically connected to the metal line segments 131 of the signal-feed-in unit 13 through the via hole 19.

The radiation single body 3 comprises a base body 31 and a metal layer 32 which is arranged on a surface of the base body 31. Namely, the radiation single body 3 is composed of a base body 31 and a metal layer 32 which is arranged on a surface of the base body 31. The metal layer 32 comprises a plurality of blocks 321 in different sizes or comprises a plurality of lines. Namely, the metal layer 32 is composed of a plurality of blocks 321 in different sizes or is composed of a plurality of lines. The blocks 321 are arranged on the surface of the base body 31 directly, or the lines helically winds around and are arranged on the surface of the base body 31 or inside the base body 31. One side of the metal layer 32 of the radiation single body 3 is electrically connected to the via holes 19. The other side of the metal layer 32 is electrically connected to the third-ground surface 16. In FIG. 3 and FIG. 4, the base body 31 is made of a ceramic material or a fiberglass.

The frequency-modulation element 4 is arranged in the short gap 18 and is electrically connected between the second-ground surface 14 and the third-ground surface 18, so that the large third-ground surface 16 (namely, the metal plate) in the L-shaped is added into the chip-type antenna improved structure of the present invention. After the frequency-modulation element 4 which is arranged at a terminal of the third-ground surface 16 is electrically connected to the second-ground surface 14, in any environments, a size of the third-ground surface 16 (namely, the metal plate) does not need to be changed. Only an inductance value or a capacitance value of the frequency-modulation element 4 which is arranged at the terminal of the third-ground surface 16 needs to be adjusted to adjust a receiving-transmitting frequency of the chip-type antenna improved structure. In FIG. 3 and FIG. 4, the frequency-modulation element 4 is an inductor or a capacitor.

By the design of the third-ground surface 16 extended/arranged on the second-clearance area 15 of the chip-type antenna improved structure mentioned above, the overall pattern of the chip-type antenna improved structure is similar with an inverted-F antenna. In any environments, the size of the extended third-ground surface 16 (namely, the metal plate) of the chip-type antenna improved structure does not need to be changed. Only the frequency-modulation element 4 needs to be adjusted to be used in any chip-type antenna structure technology fields of all Internet of Things, WiFi-2.4 GHz/5 GHz, BT, Zigbee-2.4 GHz, and so on.

Figure 5:
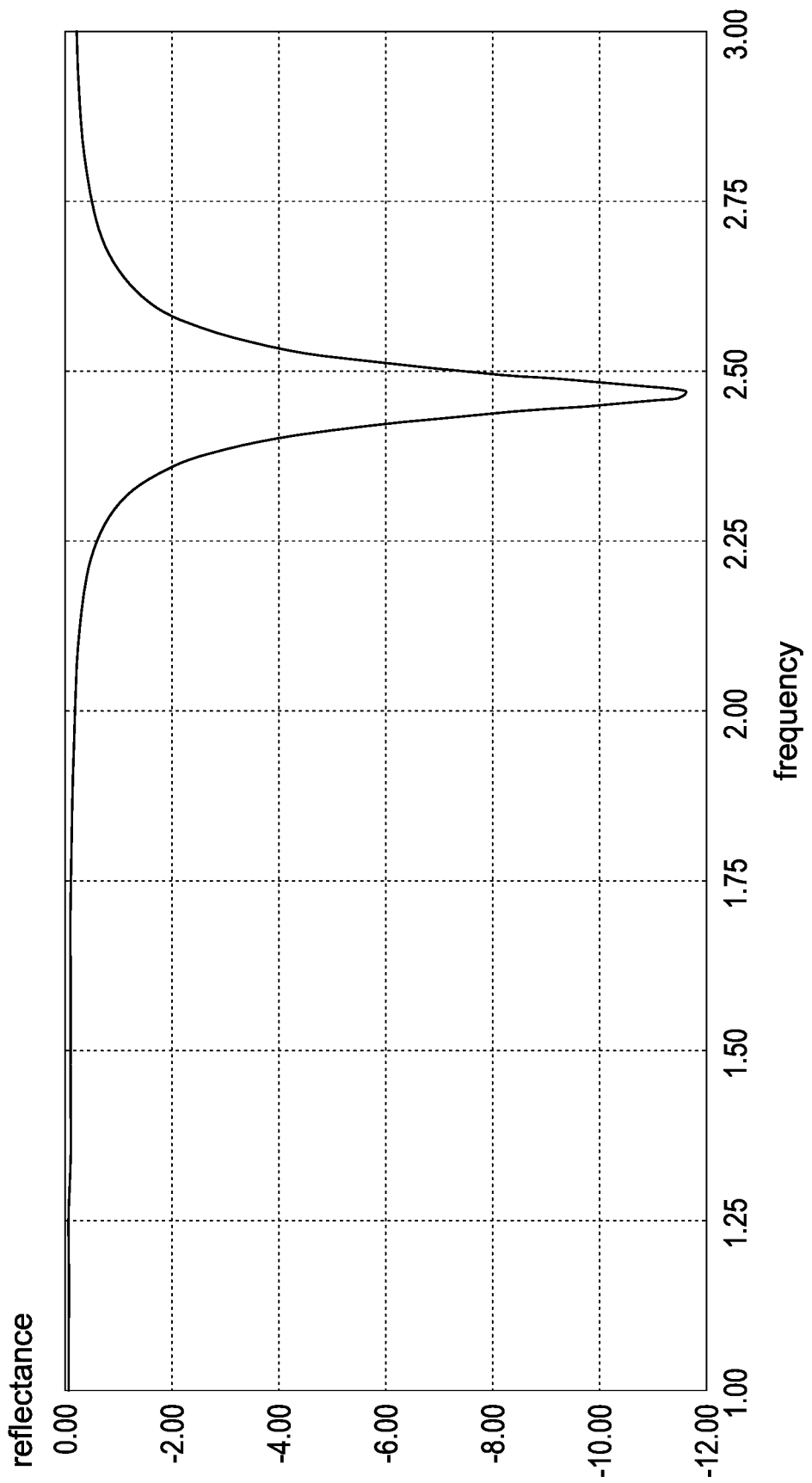
FIG. 5 shows a test curve diagram of the reflectance of the chip-type antenna improved structure of the present invention.

FIG. 5 shows a test curve diagram of the reflectance of the chip-type antenna improved structure of the present invention. As shown in FIG. 5, when the chip-type antenna improved structure is used, at ml frequency 2.45000 MHZ is −10.1816 dB. From FIG. 5, it can be seen that adjusting the matching element 2 and the frequency-modulation element 4 can achieve the predetermined target impedance, resonant frequency, bandwidth and radiation effect, and can effectively increase the antenna radiation efficiency.

In any environments, the size of the extended third-ground surface 16 (namely, the metal plate) of the chip-type antenna improved structure does not need to be changed. Only the frequency-modulation element 4 needs to be adjusted to be suitable for any communication equipment.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A chip-type antenna improved structure comprising:
a baseboard, a top of the baseboard comprising a first-ground surface, a first-clearance area and a signal-feed-in unit, the signal-feed-in unit arranged on the first-clearance area and extended between the first-ground surface, the signal-feed-in unit comprising a plurality of metal line segments, a bottom of the baseboard comprising a second-ground surface corresponding to the first-ground surface, a second-clearance area corresponding to the first-clearance area and a third-ground surface arranged on the second-clearance area, the baseboard defining a plurality of via holes through the baseboard, the first-ground surface electrically connected to the second-ground surface through the via holes;
at least one matching element electrically connected between the metal line segments, and between the metal line segments and the first-ground surface;
a radiation single body, one side of the radiation single body electrically connected to the signal-feed-in unit through one of the via holes, another side of the radiation single body electrically connected to the third-ground surface; and
a frequency-modulation element electrically connected between the second-ground surface and the third-ground surface to adjust the frequency-modulation element to adjust a receiving-transmitting frequency of the chip-type antenna improved structure.

2. The chip-type antenna improved structure in claim 1, wherein the first-ground surface is in a concave-shape; the first-clearance area is in a convex-shape.

3. The chip-type antenna improved structure in claim 2, wherein the signal-feed-in unit is arranged on the first-clearance area and is extended to a concave-convex junction between the first-ground surface.

4. The chip-type antenna improved structure in claim 1, wherein the third-ground surface is in an L shape.

5. The chip-type antenna improved structure in claim 1, wherein a long gap and a short gap are defined between the third-ground surface and the second-ground surface.

6. The chip-type antenna improved structure in claim 1, wherein the radiation single body comprises a base body and a metal layer arranged on a surface of the base body.

7. The chip-type antenna improved structure in claim 1, wherein the base body is made of a ceramic material or a fiberglass.

8. The chip-type antenna improved structure in claim 6, wherein the metal layer comprises a plurality of blocks in different sizes or comprises a plurality of lines.

9. The chip-type antenna improved structure in claim 8, wherein the blocks are arranged on the surface of the base body directly.

10. The chip-type antenna improved structure in claim 8, wherein the plurality of lines helically wind around and are arranged on the surface of the base body or inside the base body.

11. The chip-type antenna improved structure in claim 1, wherein the at least one matching element and the frequency-modulation element are inductors or capacitors.

* * * * *